(12) United States Patent
Moon et al.

(10) Patent No.: US 6,891,713 B2
(45) Date of Patent: May 10, 2005

(54) ELEMENT STORAGE LAYER IN INTEGRATED CIRCUITS (75) Inventors: Bum Ki Moon, Tokyo (JP); Gerhard Beitel, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 74 days.

(21) Appl. No.: 10/250,209

(22) Filed: Jun. 13, 2003

(65) Prior Publication Data

US 2004/0057193 A1 Mar. 25, 2004

Related U.S. Application Data (63) Continuation-in-part of application No. 10/065,127, filed on Sep. 19, 2002, now Pat. No. 6,621,683.

(51) Int. Cl.⁷ ............................................. H01G 4/228
(52) U.S. Cl. .................... 361/306.3; 361/303; 257/303; 257/306
(58) Field of Search .............................. 361/303, 306.3, 361/311–313, 321.2, 301.4, 301.5; 257/295, 296, 303, 306, 310

(56) References Cited

U.S. PATENT DOCUMENTS 5,005,102 A * 4/1991 Larson ........................ 361/313
5,563,762 A * 10/1996 Leung et al. ............. 361/301.4

* cited by examiner

Primary Examiner—Anthony Dinkins
(74) Attorney, Agent, or Firm—Horizon IP Pte Ltd (57) ABSTRACT Reduced degradation to capacitor properties is disclosed. A hydrogen storage layer is provided over at least a portion a top capacitor electrode. The hydrogen storage layer absorbs and stores hydrogen, preventing hydrogen from diffusing to the capacitor. The hydrogen storage layer has, for example, lanthium nitride, titanium zirconium nitride, amorphous sm—co, nanostructured carbon, or a combination thereof.

38 Claims, 6 Drawing Sheets

ELEMENT STORAGE LAYER IN INTEGRATED CIRCUITS

CROSS REFERENCE TO RELATED APPLICATIONS

This application is a continuation-in-part of patent application entitled "Memory Cells with Improved Reliability", U.S. Ser. No. 10/065,127 filed Sep. 19, 2002 now U.S. Pat. No. 6,621,683 which is herein incorporated by reference for all purposes.

BACKGROUND OF INVENTION

Figure 1:
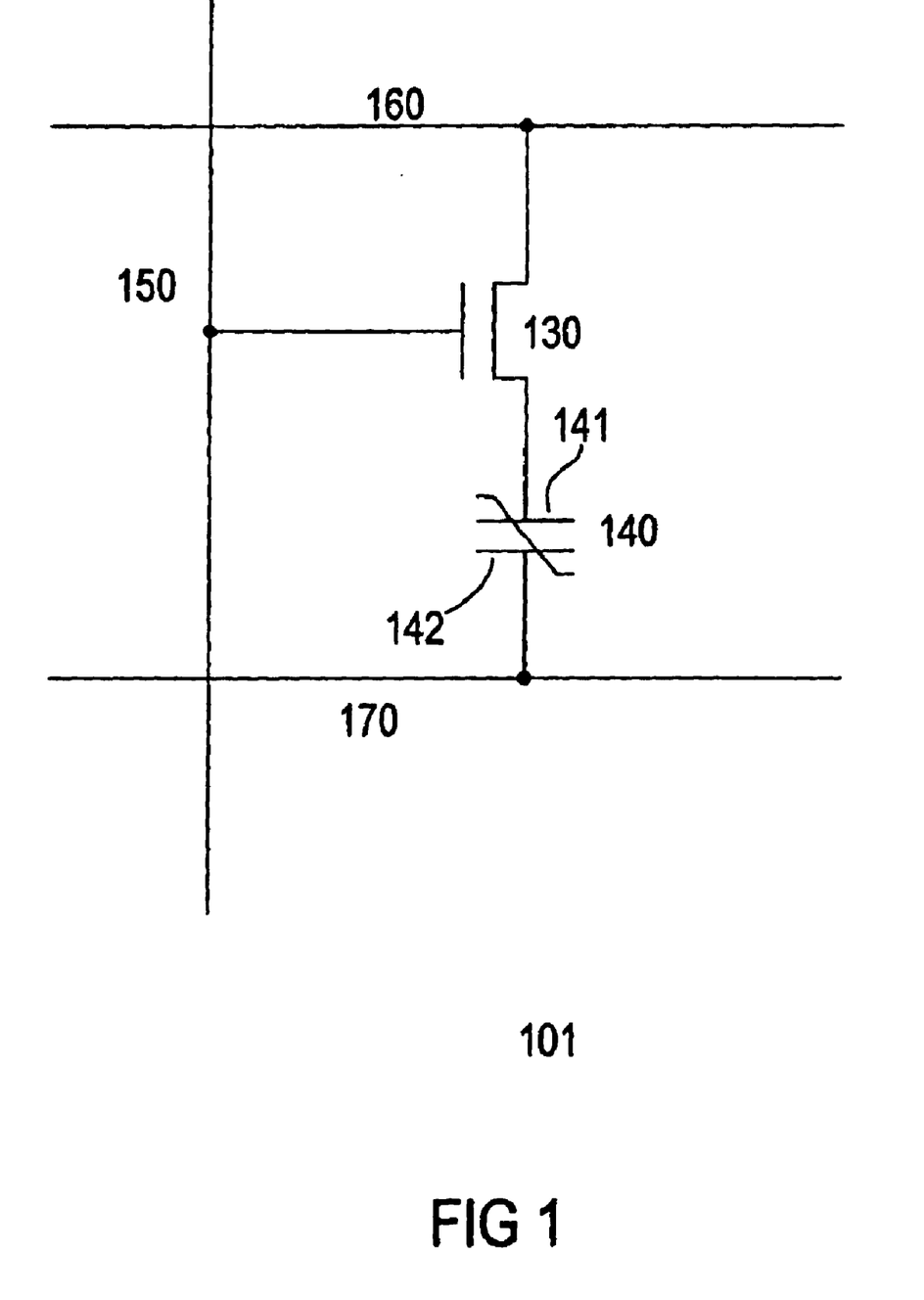
FIG. 1 shows a ferroelectric memory cell.

FIG. 1 shows a conventional ferroelectric memory cell 101 having a transistor 130 and a ferroelectric capacitor 140. The capacitor comprises a ferroelectric ceramic thin film sandwiched between first and second electrodes 141 and 142. Electrode 142 is coupled to a plateline 170 and electrode 141 is coupled to the transistor which selectively couples or decouples the capacitor from a bitline 160, depending on the state (active or inactive) of a wordline 150 coupled to the transistor gate. A plurality of cells are interconnected by platelines, bitlines, and wordlines to form an array.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

Figure 2:
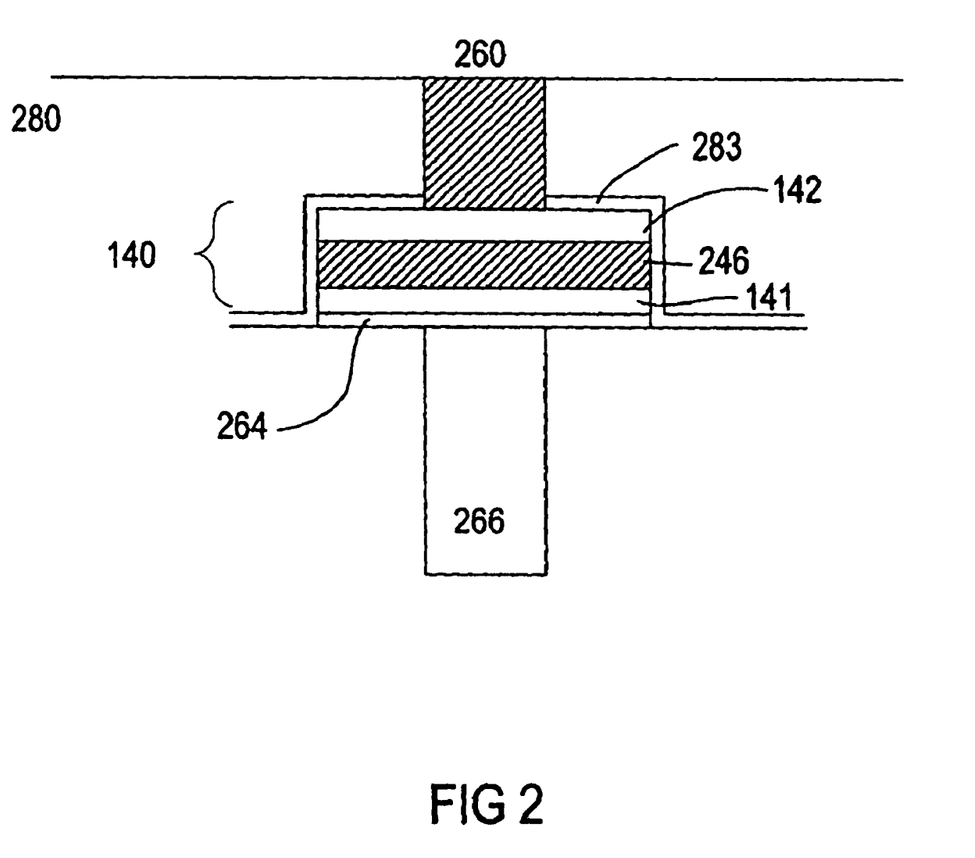
FIG. 2 shows a cross-sectional view of a capacitor on plug structure.

FIG. 2 shows a cross section of a conventional ferroelectric capacitor 140 on a plug 266. As shown, the capacitor comprises a ferroelectric layer 246 sandwiched between bottom and top electrodes 141 and 142. The electrodes typically are formed from a noble metal such as platinum. The bottom electrode 141 is coupled to the plug which, for example, is in contact with a diffusion region of the cell transistor. A barrier layer 264 can be provided below the lower electrode to protect the plug from oxidation. A dielectric layer 280 serves as the interlevel dielectric layer. The dielectric layer typically comprises TEOS. A contact 260 is provided, coupling the top capacitor electrode to, for example, a plateline.

During certain processes, hydrogen is present. The hydrogen can be part of the process or generated as part of the process (e.g., by product). For example, hydrogen is used as part of the ambient in forming gas anneals or generated as by-products in plasma TEOS or tungsten CVD deposition processes. The presence of hydrogen, however, is undesirable as it can degrade the properties of the ferroelectric materials of the capacitor. The degradation mechanism is mainly due to the reduction of the capacitor oxide layer affected by H—O bonding.

Conventionally, to reduce capacitor degradation or failure caused by hydrogen, an encapsulation layer 283 is provided. The encapsulation layer surrounds the top and side of the capacitor, protecting the capacitor from diffusion of hydrogen. The encapsulation layer comprises an insulating material which inhibits diffusion of hydrogen, such as silicon oxide or aluminum oxide. An insulating material is required to prevent shorting of the capacitor.

However, in order for the contact to be electrically coupled or have good contact characteristics, the portion of the insulating encapsulation layer is removed in the contact region. As a result, hydrogen can through the contact area to the capacitor during, for example, decomposition of TEOS resulting from contact opening formation, tungsten fill process to form the contact or forming gas anneals (typically formed after contact formation), thus degrading or causing failure to the capacitor.

From the foregoing discussion, it is desirable to provide a capacitor with improved resistance against the diffusion of hydrogen.

SUMMARY OF INVENTION

The invention relates generally to protecting features sensitive to harmful elements, such as hydrogen. In one embodiment, a feature comprises a capacitor. More preferably, the capacitor comprises a ferroelectric capacitor. The capacitor is used as a capacitor of a memory cell. A plurality of memory cells are interconnected to form a memory array of an integrated circuit. In one embodiment, a capacitor includes top and bottom electrodes with a capacitor dielectric disposed therebetween. An element storage layer covers and is electrically coupled to the top electrode. The element storage layer comprises a material which absorbs or stores hydrogen.

DETAILED DESCRIPTION

The invention relates to reducing failures or degradation of device performance in integrated circuits. The failures or degradation in performance, for example, is due to hydrogen. Applying the general principles of the present invention to reduce failures or degradation caused by other harmful elements is also useful. Although the invention is described in the context of a capacitor, it can also be applied to other types of circuit features. For example, the present invention may also be useful to protect transistors from harmful elements which can degrade its performance.

Figure 3:
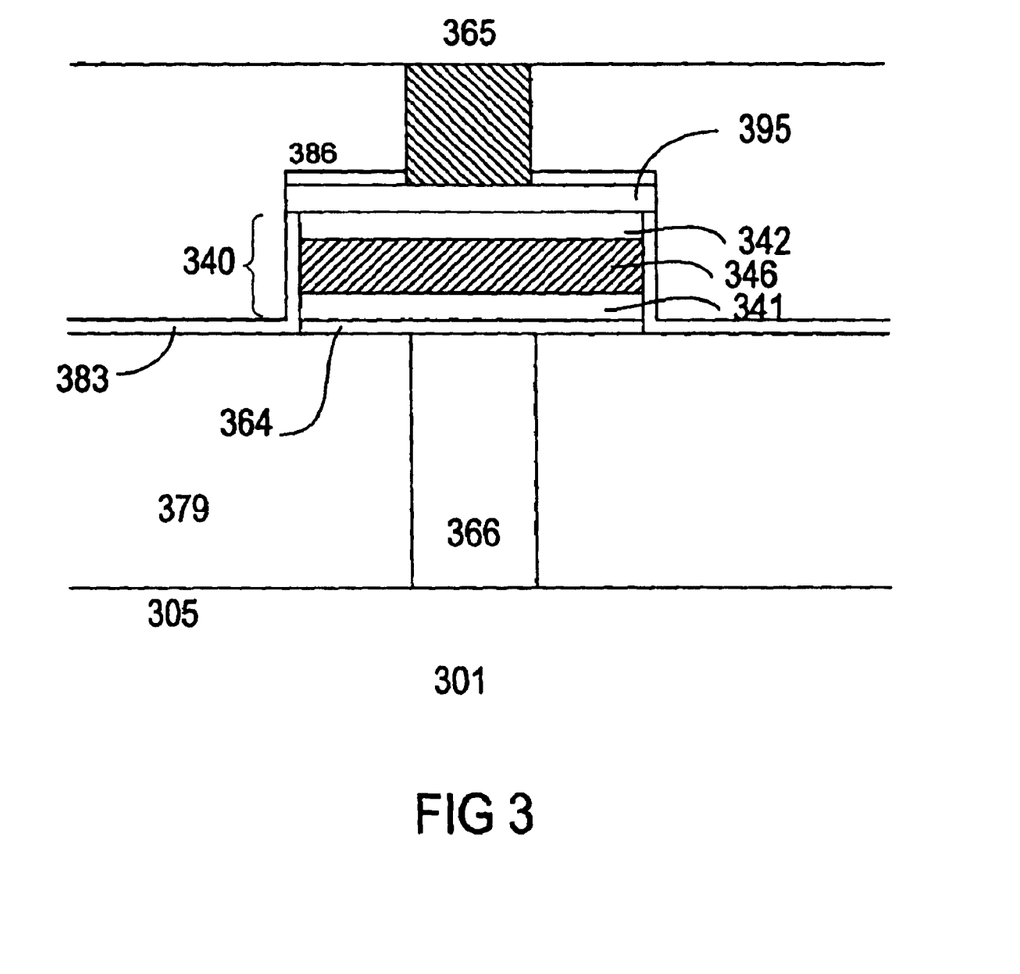
FIG. 3 shows an embodiment of the invention.

FIG. 3 shows a capacitor structure 301 in accordance with one embodiment of the invention. The capacitor 340, in one embodiment, comprises first (e.g., top) and second (e.g., bottom) electrodes 341 and 342. A capacitor dielectric layer 346 is disposed between the electrodes. Providing a capacitor structure having more than first and second electrodes with capacitor dielectrics therebetween is also useful. For example, the capacitor structure can include more than one capacitors stacked together or subcapacitors stacked to form a capacitor. Such capacitor features are described in, for example, US patent applications titled "Series Architecture" (U.S. Ser. No. 10/065,124) and "Memory Architecture with Series Grouped Memory Cells" (U.S. Ser. No. 10/248,234), which are herein incorporated by reference for all purposes.

In one embodiment, the capacitor comprises a ferroelectric capacitor. Other types of capacitors are also useful. The capacitor dielectric comprises a ferroelectric material, such as PZT. Other types of ferroelectric materials, including SBT, are also useful. The electrodes can be formed from a noble metal, such as Pt, Ir, Pd, Ru, or alloys thereof. Other types of conductive materials, such as $SrRuO_3$, $La_{0.5}Sr_{0.5}O_3$, $LaNiO_3$, or $Yba_2Cu_3O_7$, are also useful. Alternatively, other types of conductive or dielectric materials can be used to form other types of capacitors, such as those employed in dynamic random access memory (DRAM) cells. For example, the capacitor dielectric can be formed from dielectric materials, such as high k or other dielectric materials.

The bottom electrode is, for example, coupled to a conductive plug 366. The conductive plug comprises, for example, tungsten or poly-Si. Other types of conductive materials can also be used. If the plug is poly-Si, a metal silicide layer can be provided over the plug. The metal silicide, for example, comprises titanium or cobalt. Other metal suicides are also useful.

A barrier layer 364 can be provided between the plug and the lower electrode to inhibit the diffusion of oxygen to the plug. The barrier layer, for example, comprises iridium. Other conductive barrier materials, such as$IrO_2$, Pd, Hf or Ru are also useful. An adhesion layer can also be provided between the barrier layer and dielectric layer 379. The adhesion layer comprises, in one embodiment, titanium. Other types of adhesion promoting materials can also be used.

In accordance with one embodiment of the invention, an element storage layer 395 is provided. The element storage layer, in one embodiment, comprises a conductive material. Preferably, the element storage layer is electrically coupled to the top capacitor electrode. More preferably, the element storage contacts the top capacitor electrode. In one embodiment, the element storage layer absorbs and storeshydrogen. The element storage layer comprises, for example, lanthium nitride ($LaNi_x$). Other materials, such as titanium-zirconium nitride ($Ti_{45}Zr_{38}Ni$ 17), amorphous Sm—Co, nanostrutured carbon, or other types of materials which absorb or store hydrogen can also be used.

In an alternative embodiment, the element storage layer comprises a multi-layered structure. The multi-layered structure can be formed from hydrogen storage materials or a combination hydrogen and nonhydrogen storage materials. Preferably, the non-hydrogen storage materials block the diffusion of hydrogen. Providing non-hydrogen storage materials which don't block the diffusion of hydrogen is also useful. Such materials, for example, include Pt, Ir, Rd, Hf, Ru, or a combination thereof. More preferably, the various layers of the multi-layered element storage stack are conductive materials.

The element storage layer, in one embodiment, covers the surface of the top electrode. Preferably, the element storage layer covers at least the complete surface of the top electrode. Providing an element storage layer which partially covers the top electrode is also useful. For applications where the element storage layer covers less than the complete surface of the top electrode, it should at least exceed the area of the contact coupled to the top electrode. The thickness of the element storage layer should be sufficient to prevent hydrogen from penetrating to the ferroelectric material. Typically, the thickness of the element layer is about 1 nm–1 um. Other thicknesses can also be used, depending on the application (e.g., material, thermal budget, and amount of hydrogen present or generated in the process flow).

In one embodiment, a barrier layer 386 is provided on the surface of element storage layer. A barrier layer 383 can also be provided on the sides of the capacitor protecting at least the sides of the electrodes and dielectric layer. The barrier layers are formed from a material which prevents the diffusion of, for example, hydrogen. Preferably, the barrier layers comprise a non-conductive material. In one embodiment, the barrier layers comprise silicon nitride or aluminum oxide. Other materials, such as $TiO_2$, $HfO_2$, $ZrO_2$, $CeO_2$, their silicates and a combination thereof are also useful. The use of the barrier layers advantageously enhances the robustness of the element storage layer. Alternatively, a barrier layer encapsulates the capacitor, including the element storage layer. In the case where the barrier layer encapsulates the capacitor, the portion in the contact area is removed.

Figure 4:
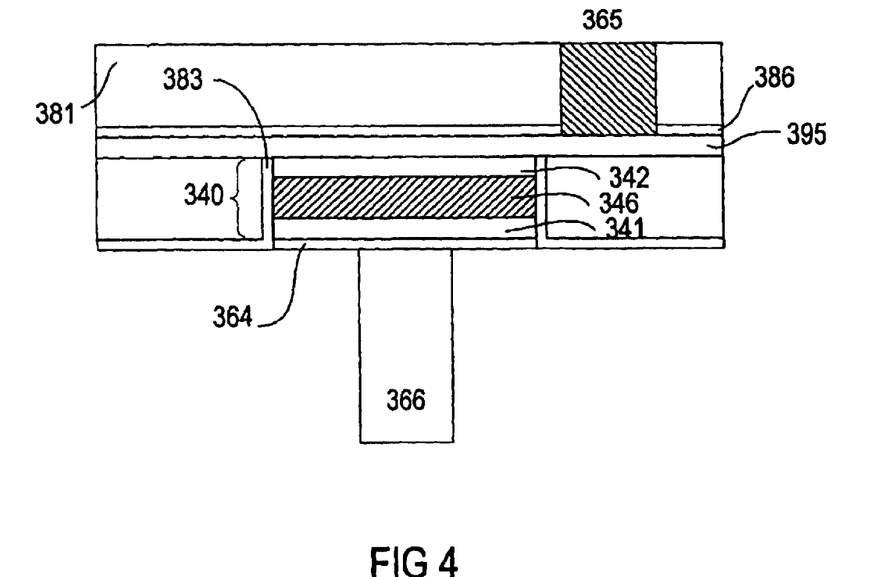
FIG. 4 shows a different embodiment of the invention.

In a different embodiment, the element storage layer extends at least beyond one side of the top electrode, as shown in FIG. 4. The extension allows at least a portion of contact 365 formed in the dielectric 381 to be offset from the top electrode of the capacitor. Preferably, the extension allows the contact to be completely offset from the capacitor. By providing an offset contact, a longer diffusion path for hydrogen is created. This improves the protective properties of the element storage layer.

The capacitor structure 340 is, for example, coupled to a transistor to form a memory cell. In one embodiment, the plug 366 is coupled to a first diffusion region of the transistor. A second diffusion region is coupled to a bitline while a gate of the transistor is coupled to or serves as a wordline. A plurality of memory cells are interconnected by wordlines and bitlines to form a memory array. The memory cells can be arranged in an open or a folded bitline architecture. In such architectures, the top capacitor electrode is typically coupled to a plateline. For non-ferroelectric capacitor, the top electrode is coupled to a reference voltage, such as $V_{DD}/2$ or ground. Other types of architectures, such as series architectures, are also useful. Series architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. For series architectures, the top capacitor electrode is coupled to, for example, the second diffusion region of the cell transistor.

Figure 5:
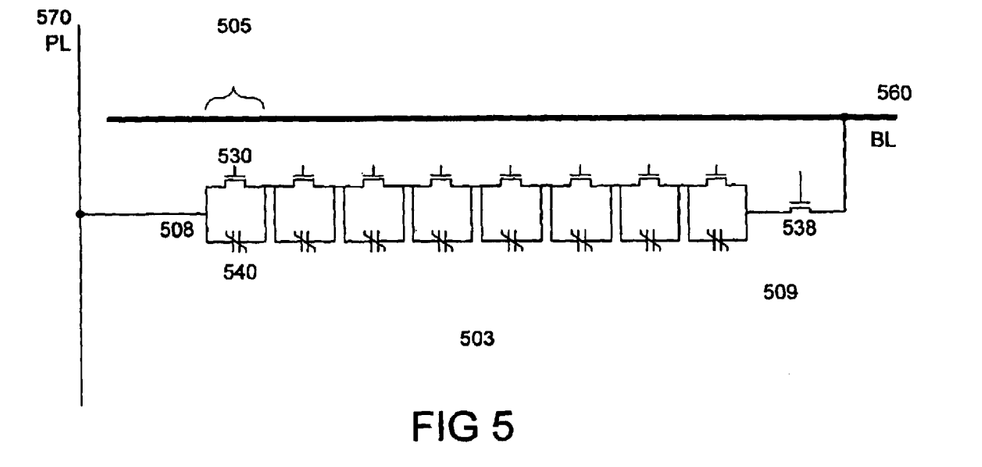
FIG. 5 shows a group of memory cells arranged in a series architecture.

Referring to FIG. 5, a group 503 of memory cells 505 is arranged in a series architecture. The memory cells of the group, each comprising a transistor 530 coupled to a capacitor 540 in parallel, are coupled in series. One end 509 of a group is coupled to a bitline 560 via, for example, a select transistor 538, while the other end 508 is coupled to a plateline 570. The gates of the transistors are coupled to respective wordlines. To form an array, a plurality of cell groups are interconnected by wordlines, bitlines and plateline(s). The bitlines are coupled to a sense amplifier circuit to facilitate memory accesses (e.g., reads and writes). Generally, a pair of bitlines is coupled to a sense amplifier, forming a column in the array.

FIGS. 6–9 show a process of forming a feature in accordance with one embodiment of the invention. The feature can comprise a circuit feature which is or includes material sensitive to an element. In one embodiment, the feature is or includes material which is sensitive to hydrogen. Alternatively, the feature can be used to form, for example, electro-mechanical, devices. For such applications, the substrate can comprise various types of materials which can support the features. For example, the substrate can be formed from glass or other types of materials, depending on the application.

In one embodiment, the feature comprises a capacitor. Preferably, the capacitor comprises a ferroelectric capacitor.

Figure 6:
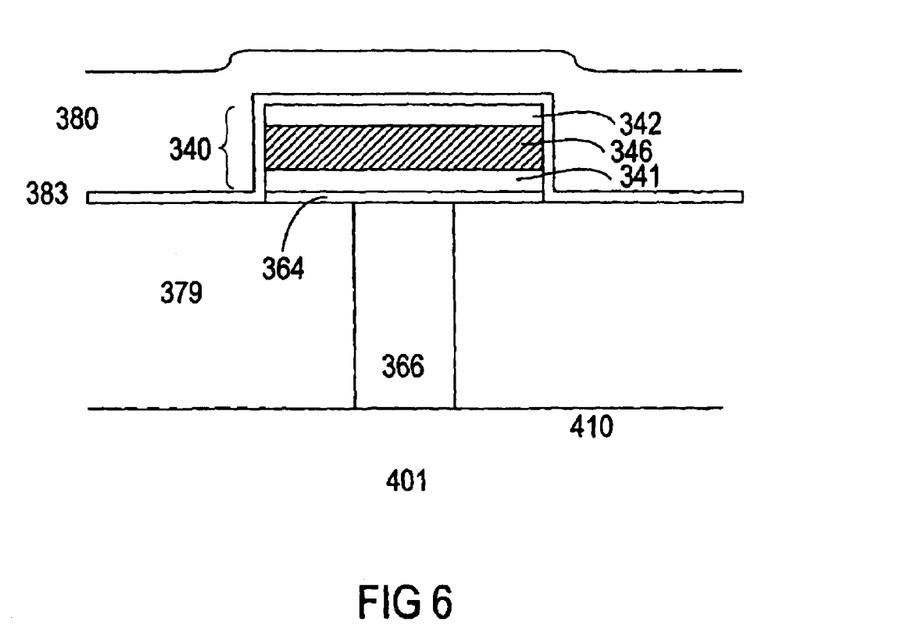
FIGS. 6–9 show a process for fabricating a capacitor over plug in accordance with one embodiment of the invention.

As shown in FIG. 6, a substrate 410 is provided. The substrate, in one embodiment, comprises silicon or other types of semiconductor material. The substrate can be prepared with, for example, a dielectric layer 379. The dielectric layer serves as an interlevel dielectric which covers other circuit features, such as transistors formed on the substrate. The substrate is prepared with a capacitor structure 401, which includes a capacitor 340 coupled to a plug 366. The COP structure can be formed by known techniques. Such techniques may include forming the plug in the dielectric layer. If the plug is poly-Si, a metal silicide layer can be formed over the plug prior to the capacitor layers. The metal silicide, for example comprises titanium or cobalt. Other metal suicides are also useful. The metal silicide can be formed by conventional techniques. The plug, for example, contacts a diffusion region of a transistor. After the plug is formed, first electrode 341, capacitor dieletric layer 346, and second electrode 342 are deposited on the surface of the dielectric layer and patterned to form the capacitor. The various layers can be patterned individually or together. For example, the bottom electrode can be patterned separately from the intermediate and top electrode layers. Preferably, the layers are patterned together.

A barrier layer 364 may be provided between the first electrode and the plug. The barrier layer comprises, for example, Ir or $IrO_2$. Other materials, which can inhibit the diffusion oxygen can also be used. To promote adhesion between the barrier layer and dielectric layer, an adhesion layer can be provided beneath the barrier layer. The adhesion layer comprises, in one embodiment, titanium. Other types of adhesion promoting materials can also be used, including non-conductive materials. For non-conductive materials, the adhesion layer can remain on the ILD except wherein the plugs are located. Various techniques, for example PVD and CVD, can be used to form the barrier and adhesion layers.

After the capacitor is formed, an encapsulation layer 383 can be deposited to encapsulate the capacitor. The encapsulation layer serves to protect the capacitor from diffusion of hydrogen. In one embodiment, the encapsulation layer comprises $Al_2O_3$, which can be deposited by, for example, sputter or ALD (atomic layer deposition) or other conventional deposition techniques. Other types of materials, such as $Si_3N_4TiO_2$, $HfO_2$, $ZrO_2$, $CeO_2$, their silicates or a combination thereof, can also be used. A dielectric layer 380 is deposited over the substrate, covering the capacitor.

In one embodiment, excess portions of the dielectric layer 380 and the encapsulation layer above the capacitor are removed by, for example, chemical mechanical polishing (CMP). The CMP provides a planar surface with the dielectric layer and the top electrode.

Figure 7:
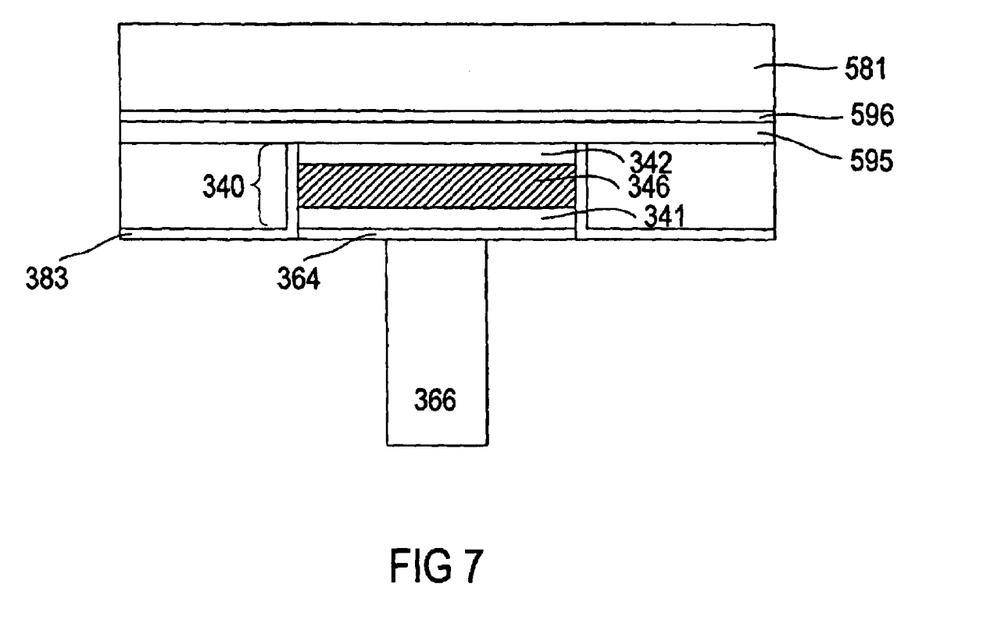

Referring to FIG. 7, a device layer 595 is deposited over the substrate surface. The device layer serves as the storage element layer. In one embodiment, the device layer comprises a material which absorbs or stores hydrogen. The device layer can be formed from a single layer or a plurality of layers, creating a device layer stack. Preferably, the device layer comprises a conductive material. Materials such as lanthium nitride, titanium zirconium nitride, amorphous Sm—Co, graphite or a combination thereof can be used to form the device layer. Other types of materials which absorb or store hydrogen can also be used. For a device layer stack, more than one type of hydrogen storage material or a combination of hydrogen storage and non-hydrogen storage materials can be used. Preferably, the non-hydrogen storage material is conductive. Various techniques, such as PVD, CVD, spin-on, CSD, electroplating, or hydro-thermal synthesis, can be used to form the element storage layer. The device layer is patterned to form the element storage layer which is electrically coupled to the top capacitor electrode. In one embodiment the device layer is patterned to cover the top electrode. Preferably, the device layer is patterned to overlap at least one side of the capacitor. The overlap enables a contact that is electrically coupled to the top electrode to be partially or fully offset the capacitor. The element storage layer of different capacitors should be isolated from each other to avoid shorting. Alternatively, the device layer is patterned to cover a portion of the top electrode. In such case, the device layer should cover the top electrode sufficiently to accommodate the contact that is electrically coupled thereto.

In another embodiment, the element storage layer can be formed using damascene techniques. Such techniques include, for example, depositing a dielectric layer above the capacitor and patterning it to create a trench corresponding to the element storage layer. Material for forming the element storage layer is deposited, filling the trench and covering the surface of the dielectric layer. Excess materials above the dielectric layer are removed by, for example, CMP. As a result, the element storage layer is formed in the trench. A barrier layer 596 can be deposited over the element storage layer. This is particularly useful for applications where the element storage layer doesn't completely cover the top capacitor electrode. Various techniques, such as PVD, ALD, CVD, spin-on, CSD, electro-plating, or hydro-thermal synthesis, can be used to form the encapsulation layer. The barrier layer protects the capacitor from diffusion of hydrogen. The encapsulation layer comprises, for example, $Al_2O_3$. Other types of materials, such as $Si_3N_4$, can also be used. Since the barrier layer is not conductive, it need not be patterned to avoid shorting other capacitors. A dielectric layer 581 is then deposited over the element storage layer or barrier layer.

Figure 8:
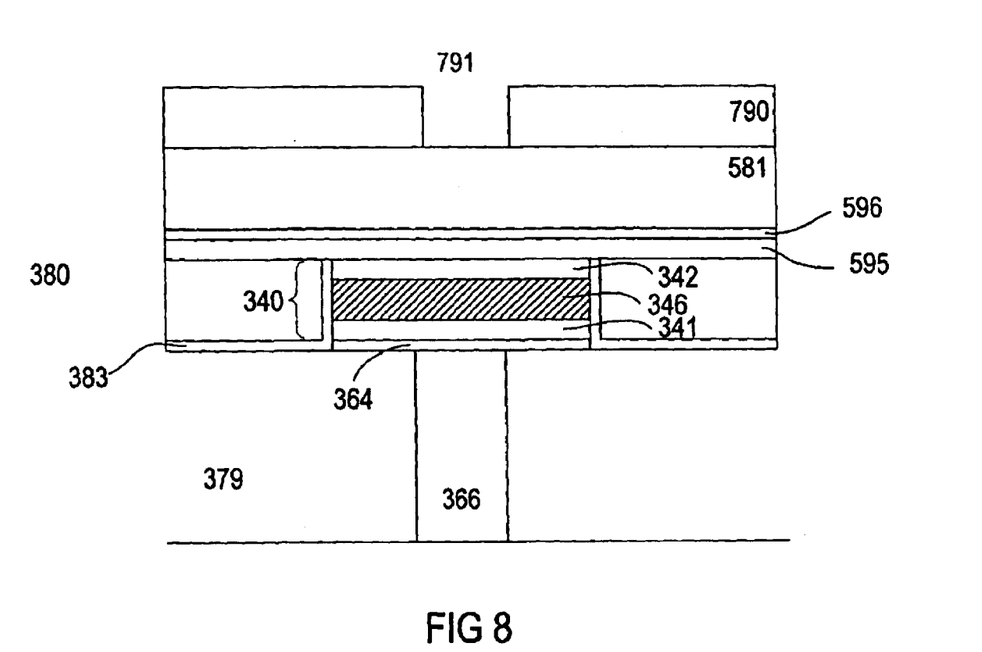
Figure 9:
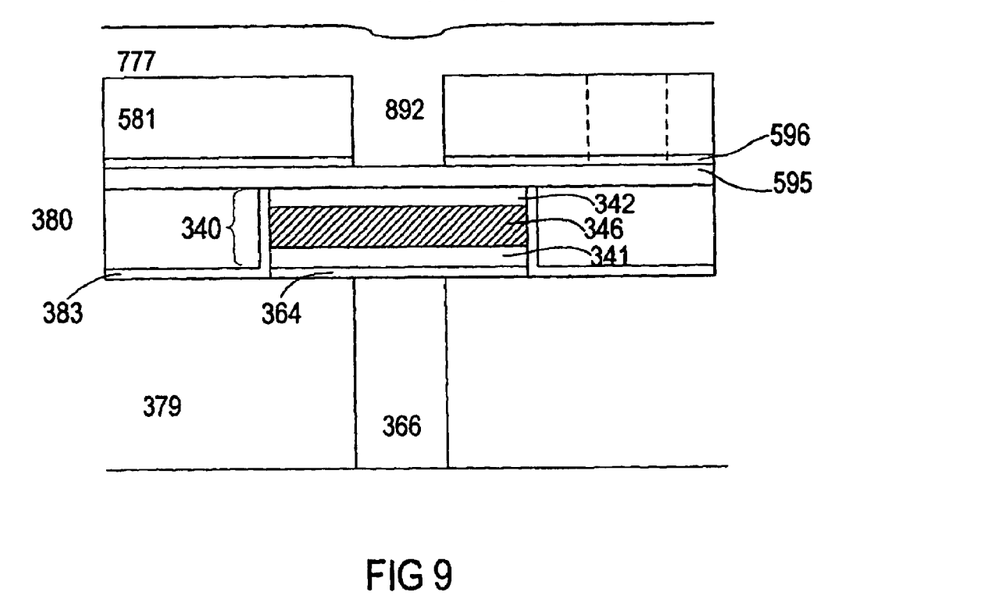

Referring to FIG. 8, a mask layer 790 is deposited over the dielectric layer. The mask layer, in one embodiment, comprises photoresist. The photoresist is selectively exposed and patterned to form opening 791, exposing a portion of the dielectric layer. An anisotropic etch, such as RIE, is performed to create a contact opening 892 in dielectric layer 581, as shown in FIG. 9.

For applications where the element storage layer overlaps the capacitor, the contact opening can be partially or completely offset from the top electrode of the capacitor, as shown by the dotted lines. Preferably, the contact is completely offset from the capacitor. A conductive material 777 is deposited on the substrate, filling the contact opening. Excess conductive material on the substrate surface is removed by, for example, CMP. The process continues, in one embodiment, to complete the memory cell. For example, the necessary interconnections to plateline and bitlines are formed.

In yet another embodiment, the element storage layer can be provided over the top capacitor electrode prior to forming the encapsulation layer 383. The element storage layer and other capacitor layers can be patterned together, separately, or a combination of both (e.g., some layers are patterned together and some separately). In such cases, the element storage layer either is aligned with or partially covers the capacitor layers. The encapsulation layer is then formed on the substrate, covering the capacitor and element storage layer. The process continues, as described previously to complete the memory cells.

While the invention has been particularly shown and described with reference to various embodiments, it will be recognized by those skilled in the art that modifications and changes may be made to the present invention without departing from the spirit and scope thereof. The of the invention should therefore be determined not with reference to the above description but with reference to the appended claims along with their full scope of equivalents.

What is claimed is:

1. A capacitor structure comprising:
   top and bottom electrodes;
   a capacitor dielectric disposed between top and bottom electrodes; and
   an element storage layer covering and electrically coupled to the top electrode, the element storage layer absorbing or storing element harmful to the capacitor.

2. The capacitor structure of claim 1 wherein the capacitor dielectric comprises a ferroelectric material to form a ferroelectric capacitor of a memory cell, wherein a plurality of memory cells arc interconnected to form a memory array of an IC.

3. The capacitor structure of claim 1 is a capacitor structure of a memory cell, wherein a plurality of memory cells are interconnected to form a memory array of an IC.

4. The capacitor structure of claim 1, 2 or 3 wherein the element storage layer covers the top electrode at least partially to sufficiently accommodate a contact electrically coupled to the top electrode or overlaps the top electrode to partially or completely offset the contact electrically coupled to the top electrode.

5. The capacitor structure of claim 4 wherein the element storage layer absorbs or stores hydrogen.

6. The capacitor structure of claim 5 wherein the element storage layer comprises a material selected from lanthium nitride, titanium zirconium nitride, amorphous sm—co, nanostructured carbon, or a combination thereof.

7. The capacitor structure of claim 5 wherein the element storage layer comprises a plurality of sublayers which absorb or store hydrogen or a combination of sublayers which do and do not absorb or store hydrogen.

8. The capacitor structure of claim 7 wherein the sublayers which absorb hydrogen comprise a material selected from lanthium nitride, titanium zirconium nitride, amorphous sm—co, nanostructured carbon, or a combination thereof.

9. The capacitor structure of claim 4 further comprises a barrier layer protecting at least sides of the capacitor.

10. The capacitor structure of claim 9 wherein the element storage layer absorbs or stores hydrogen.

11. The capacitor structure of claim 10 wherein the element storage layer comprises a material selected from lanthium nitride, titanium zirconium nitride, amorphous sm—co, nanostructured carbon, or a combination thereof.

12. The capacitor structure of claim 10 wherein the element storage layer comprises a plurality of sublayers which absorb or store hydrogen or a combination of sublayers which do and do not absorb or store hydrogen.

13. The capacitor structure of claim 12 wherein the sublayers which absorb hydrogen comprise a material selected from lanthium nitride, titanium zirconium nitride, amorphous sm—co, nanostructured carbon, or a combination thereof.

14. The capacitor structure of claim 9 wherein the barrier layer comprises a material which prevents the diffusion of hydrogen.

15. The capacitor structure of claim 14 wherein the element storage layer absorbs or stores hydrogen.

16. The capacitor structure of claim 15 wherein the element storage layer comprises a material selected from lanthium nitride, titanium zirconium nitride, amorphous sm—co, nanostructured carbon, or a combination thereof.

17. The capacitor structure of claim 15 wherein the element storage layer comprises a plurality of sublayers which absorb or store hydrogen or a combination of sublayers which do and do not absorb or store hydrogen.

18. The capacitor structure of claim 17 wherein the sublayers which absorb hydrogen comprise a material selected from lanthium nitride, titanium zirconium nitride, amorphous sm—co, nanostructured carbon, or a combination thereof.

19. The capacitor structure of claim 4 further comprises a barrier layer protecting at least sides of the capacitor, surface of the element storage layer and surface of top electrode if the element storage layer does not cover the surface of the top electrode completely.

20. The capacitor structure of claim 19 wherein the element storage layer absorbs or stores hydrogen.

21. The capacitor structure of claim 20 wherein the element storage layer comprises a material selected from lanthium nitride, titanium zirconium nitride, amorphous sm—co, nanostructured carbon, or a combination thereof.

22. The capacitor structure of claim 20 wherein the element storage layer comprises a plurality of sublayers which absorb or store hydrogen or a combination of sublayers which do and do not absorb or store hydrogen.

23. The capacitor structure of claim 22 wherein the sublayers which absorb hydrogen comprise a material selected from lanthium nitride, titanium zirconium nitride, amorphous sm—co, nanostructured carbon, or a combination thereof.

24. The capacitor structure of claim 19 wherein the barrier layer comprises a material which prevents the diffusion of hydrogen.

25. The capacitor structure of claim 24 wherein the element storage layer absorbs or stores hydrogen.

26. The capacitor structure of claim 25 wherein the element storage layer comprises a material selected from lanthium nitride, titanium zirconium nitride, amorphous sm—co, nanostructured carbon, or a combination thereof.

27. The capacitor structure of claim 25 wherein the element storage layer comprises a plurality of sublayers which absorb or store hydrogen or a combination of sublayers which do and do not absorb or store hydrogen.

28. The capacitor structure of claim 27 wherein the sublayers which absorb hydrogen comprise a material selected from lanthium nitride, titanium zirconium nitride, amorphous sm—co, nanostructured carbon, or a combination thereof.

29. The capacitor structure of claim 1, 2 or 3 wherein the element storage layer absorbs or stores hydrogen.

30. The capacitor structure of claim 29 wherein the element storage layer comprises a material selected from lanthium nitride, titanium zirconium nitride, amorphous sm—co, nanostructured carbon, or a combination thereof.

31. The capacitor structure of claim 29 wherein the element storage layer comprises a plurality of sublayers which absorb or store hydrogen or a combination of sublayers which do and do not absorb or store hydrogen.

32. The capacitor structure of claim 31 wherein the sublayers which absorb hydrogen comprise a material selected from lanthium nitride, titanium zirconium nitride, amorphous sm—co, nanostructured carbon, or a combination thereof.

33. A method of forming a capacitor comprising:
   providing a substrate prepared with a capacitor having top and bottom electrodes and a capacitor dielectric disposed between the electrodes; and forming an element storage layer covering at least a portion of the top electrode sufficient to accommodate a contact for coupling to the top capacitor electrode, the element storage layer comprises a material which absorbs or stores elements harmful to the capacitor.

34. The method of claim 33 wherein the capacitor dielectric comprises a ferroelectric material.

35. The method of claim 33 or 34 wherein the element storage layer absorbs or stores hydrogen.

36. The method of claim 35 wherein the element storage layer comprises a material selected from lanthium nitride, titanium zirconium nitride, amorphous sm-co, nanostructured carbon, or a combination thereof.

37. The method of claim 35 wherein forming the element storage layer comprises forming a plurality of sublayers which absorb to store hydrogen or a combination of sublayers which do and do not absorb or store hydrogen.

38. The method of claim 37 wherein the sublayers which absorb hydrogen comprise a material selected from lanthium nitride, titanium zirconium nitride, amorphous sm-co, nanostructured carbon, or a combination thereof.

* * * * *